(12) United States Patent
Topaloglu et al.

(10) Patent No.: US 7,630,850 B2
(45) Date of Patent: Dec. 8, 2009

(54) INTEGRATED CIRCUIT TESTER INFORMATION PROCESSING SYSTEM FOR NONLINEAR MOBILITY MODEL FOR STRAINED DEVICE

(75) Inventors: Rasit Onur Topaloglu, Santa Clara, CA (US); Judy Xilin An, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 255 days.

(21) Appl. No.: 11/872,509

(22) Filed: Oct. 15, 2007

(65) Prior Publication Data

US 2009/0099829 A1    Apr. 16, 2009

(51) Int. Cl.
*G01P 21/00*    (2006.01)
*G01R 19/00*    (2006.01)

(52) U.S. Cl. .................. 702/109; 702/64; 702/65; 702/188; 438/197; 438/199; 716/2; 716/8

(58) Field of Classification Search ............. 702/64–66, 702/109–123, 189–199; 716/2, 8; 73/841; 438/197, 199
See application file for complete search history.

(56) References Cited

U.S. PATENT DOCUMENTS

| | | | |
|---|---|---|---|
| 7,101,744 B1 | 9/2006 | Dyer et al. | |
| 7,442,601 B2 * | 10/2008 | Pei et al. | 438/218 |
| 2004/0149045 A1 | 8/2004 | Johnson et al. | |
| 2007/0028195 A1 * | 2/2007 | Chidambarrao et al. | 716/2 |

OTHER PUBLICATIONS

C.D. Sheraw et al., Dual Stress Liner Enhancement in Hybrid Orientation Technology, 2005 Symposium on VLSI Technology Digest of Technical Papers, pp. 12-13.

* cited by examiner

*Primary Examiner*—Edward Raymond
*Assistant Examiner*—Phuong Huynh
(74) *Attorney, Agent, or Firm*—Farjami & Farjami LLP

(57) ABSTRACT

A method for operating an integrated circuit tester information processing system includes: measuring current information from test structures for an integrated circuit having a stress liner; forming a transfer curve by simulating based on the current information with a first range of first mobility multipliers; forming an inverse transfer curve by applying an inverse transfer function to the transfer curve; forming a stress curve with second mobility multipliers from the inverse curve; and validating the second mobility multipliers by comparing a measured curve and a simulated curve with the measured curve based on the current information and the simulated curve based on stress curve.

20 Claims, 5 Drawing Sheets

INTEGRATED CIRCUIT TESTER INFORMATION PROCESSING SYSTEM FOR NONLINEAR MOBILITY MODEL FOR STRAINED DEVICE

TECHNICAL FIELD

The present invention relates generally to integrated circuit technology and more specifically to integrated circuit research and development.

BACKGROUND ART

The electronics industry progresses integrated circuit (IC) products are shrinking in size. The applications supported by these IC's are becoming more powerful with ever-increasing features and functions. This is exemplified as the telephone was transformed into the cellular phone and most recently into the camera phone. All the while these devices continue to shrink in size. Other devices that have evolved include computers, memory devices, personal music players and personal data assistants (PDA's). Each is operated by an integrated circuit die.

Integrated circuits are often manufactured in and on silicon and other integrated circuit wafers. Integrated circuits include literally millions of metal oxide semiconductor field effect transistors (MOSFET). Advances in integrated circuit technology continue to shrink the sizes of these transistors and drive for higher performance with minimum power consumption. This dichotomy has inspired various approaches to solve the need for speed at lower power.

One approach involves continued shrinkage of key features of the integrated circuit technology. This approach provides a size reduction but continues to struggle balancing cost, performance, and power. Another approach involves different integrated circuit materials or material systems, such as silicon on insulator (SOI), silicon germanium (SiGe) material, etc. These alternatives provide some technology improvements but are not mainstream today resulting in higher cost as well as constrain volume capacity.

Yet another approach is to provide performance improvement and power reduction while controlling cost. This approach squeezes as much performance per power out of a given integrated circuit technology and manufacturing through a technique called "strained" transistors. This allows use of existing integrated circuit manufacturing and technology investments to keep the cost down or extend future technology generations.

There are various strained integrated circuit approaches. Some approaches use different material systems as the SOI mentioned earlier. Again, these different material systems provide technology improvements but add cost and are not available in volume to satisfy the high volume modern electronics needs. Other "strained" approaches use mainstream integrated circuit technology and manufacturing, such as complementary metal oxide semiconductor (CMOS).

Integrated circuit technologies have seen many transistor designs and processing schemes to improve the mobility of carriers for improving performance and lowering power consumption. One way to achieve faster switching of a MOS transistor is to design the device with "strained" transistors so that the mobility of its charge carriers in the channel region is increased.

An appropriate type of stress in the channel region of an n-channel metal oxide semiconductor (NMOS) transistor is known to improve carrier mobility, which results in increased drive current for the transistor. High tensile material such as silicon nitride supplies a tensile stress in the NMOS region beneath the tensile layer.

To achieve performance improvement and power reduction in a CMOS device, typically both the PMOS transistor and the NMOS transistor are strained. The PMOS transistor must be strained to provide compression stress to the p-channel while the NMOS transistor must be strained to provide tensile stress to the n-channel. Typically, dual stress liners (DSL) may be used to accommodate the different stress requirements.

Accurate models of the effects of the stress layers over the strained transistors are essential for reliable, high volume manufacturing of integrated circuits utilizing stress liners. However, competitive time to volume pressures and the drive for profitability constrain the analysis, such as gathering test data and simulation time, of this important subject.

For example, only measurement of electrical data, such as currents $I_{deff}$ (effective drain current) or $I_{dlin}$ (linear drain current), are available to device modeling engineers for creating design models used to design and manufacture integrated circuits. For stress modeling, the electrical data need to be converted into mobility multipliers. Vast amount of mobility measurement is infeasible, whereas vast amount of electrical data measurement is possible. Design models include mobility information derived from the electrical data. However, the relationship between the electrical data and the mobility information are not accurately modeled.

Thus, a need still remains for a system that will allow integrated circuit designers to predict the impact of channel strain on their design prior to manufacture. The demand for highly reliable and long life products make it is increasingly critical that answers be found to these problems. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for operating an integrated circuit tester information processing system including: measuring current information from test structures for an integrated circuit having a stress liner; forming a transfer curve by simulating based on the current information with a first range of first mobility multipliers; forming an inverse transfer curve by applying an inverse transfer function to the transfer curve; forming a stress curve with second mobility multipliers from the inverse curve including mapping the normalized measured current to the second mobility multipliers and model fitting; and validating the second mobility multipliers by comparing a measured curve and a simulated curve with the measured curve based on the current information and the simulated curve based on stress curve.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
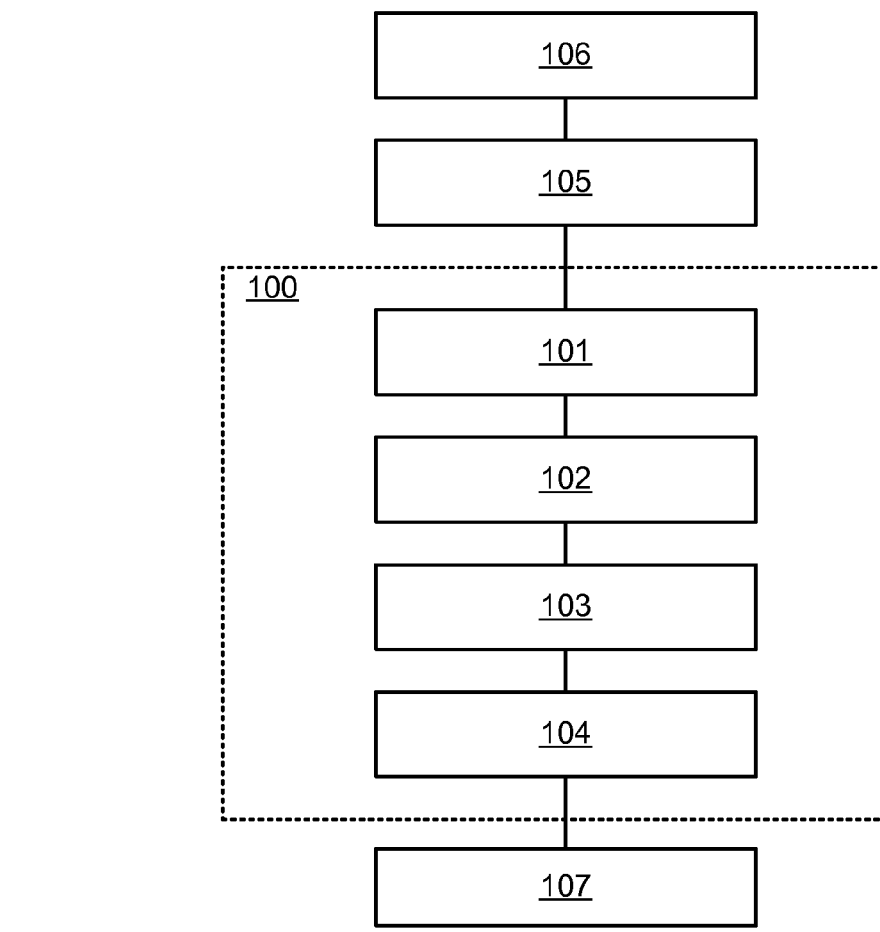
FIG. 1 shows a block diagram of an integrated tester information processing system in an embodiment of the present invention.

In the following description, numerous specific details are given to provide a thorough understanding of the invention. However, it will be apparent that the invention may be practiced without these specific details. In order to avoid obscuring the present invention, some well-known circuits, package configurations, and process steps are not disclosed in detail.

Likewise, the drawings showing embodiments of the apparatus are semi-diagrammatic and not to scale and, particularly, some of the dimensions are for the clarity of presentation and are shown greatly exaggerated in the drawing FIGs.

Similarly, although the block views in the drawings for ease of description show the invention with process flow as oriented downward, this arrangement in the figures is arbitrary and is not intended to suggest that invention should necessarily be in a downward direction. Generally, the apparatus can be operated in any direction. The same numbers are used in all the drawing figures to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

Referring now to FIG. 1, therein is shown a block diagram of an integrated circuit tester information processing system 100 according to the present invention. The integrated circuit tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the integrated circuit tester information processing system 100, and within these blocks are various commercially available techniques, methodologies, processes, circuitry, and approaches as well as the invention disclosed herein. The four fundamental blocks are discussed in the approximate chronology that the blocks are used in the integrated circuit tester information processing system 100. The goal of the four fundamental blocks is the support of a production block 107.

The integrated circuit tester information processing system 100 includes various pieces of commercially available production, test, research, and development semiconductor equipment, which operate on and manipulate information and/or data, which are generically defined herein as "information". The integrated circuit tester information processing system 100 receives information from a tester 105, which is connected to a system-under-test 106.

The tester 105 may be any number of test systems, such as a semiconductor test equipment for testing wafers or die, test bench instrumentations, compute devices, system diagnostic boards and firmware, circuitry, or any combination thereof. The interface from the tester 105 to the system-under-test 106 may be any number interconnects, such as wires, wireless, direct connections, or network connections.

The system-under-test 106 may be a single device, an array of devices, device test structures, a complete wafer, an integrated circuit die, packaged integrated circuit, system boards with integrated circuits, or a combination thereof. The system-under-test 106 may be mounted on any number of structures, such as a wafer carrier, a semiconductor test equipment board, a test bench board, or a system board.

In the generation block 101, information is generated looking at new and old integrated circuit products, new and old processes, product and process problems, unexpected or unpredictable results and variations, etc. Generation of the information may be obtained in any number of ways, such as utilizing the tester 105 to retrieve information from the system-under-test 106, stored test information, a compute device, or information over a network. It may also require new equipment and/or methods, which are described herein when required.

The generation block 101 may generate a number of information types for the integrated circuit, such as an amount of electric current or voltage levels. The generated information may be gathered from any part of the system-under-test 106, such as from the entire wafer, the entire integrated circuit, a portion of the integrated circuit, or a test structure.

As wafer utilization and size increase, the amount of test information generated increases requiring more time for the system-under-test 106, the tester 105, and personnel. The additional time increases cost and decreases throughput. The generation block 101 may be implemented in any number of ways, such as with software or circuitry.

In the extraction block 102, usable information is extracted from the generated information from the generation block 101. Essentially, the generated information is translated into more useful forms; e.g., broken apart so it can be reassembled in different forms to show different inter-relationships.

For example, most testing equipment provides raw data in massive test files. Sometimes, millions of measurements provide millions of pieces of information, which must be digested and understood. The test files seldom have user-friendly tabular and/or graphical outputs of parameters and values of interest. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

The extraction block 102 for integrated circuits may include extracting the appropriate information, such as the amount of electric current or voltage levels, from the generation block 101. The extraction block 102 may extract current or past information of various categories, such as between wafer lines, in a wafer line, at a wafer level, of an entire integrated circuit, a part of an integrated circuit, a test structure, from past data, from process data, or for reliability information. The extraction block 102 may be implemented in any number of ways, such as with software or circuitry.

In the analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

As wafer utilization and size increase, the amount of reliability and test information increases. The analysis block 103 may utilize representative portions of the information from the extraction block 102 and perform operations balancing the need to provide the reliable representative analysis results while minimizing the amount of information needed for analysis. The analysis block 103 may be implemented in any number of ways, such as with software or circuitry. For illustrative purposes, the analysis block 103 may utilize a portion of an integrated circuit, test structures, or modeling of an equivalence-based integrated circuit from the extracted data.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. The presentation block 104 may be implemented in any number of ways, such as with software or circuitry. In some cases, problems cannot even be recognized unless the information is presented in an easily understood and digested form, and this often requires new methods of presentation, which are described herein when required.

The presentation block 104 for the integrated circuit may present the extracted data and the analysis in any number of ways, such as comparing integrated circuit or wafer information and comparing fit with the selected portions or test structures. Correlation information may be presented to validate integrated circuit architecture as well as analysis fit.

Figure 2:
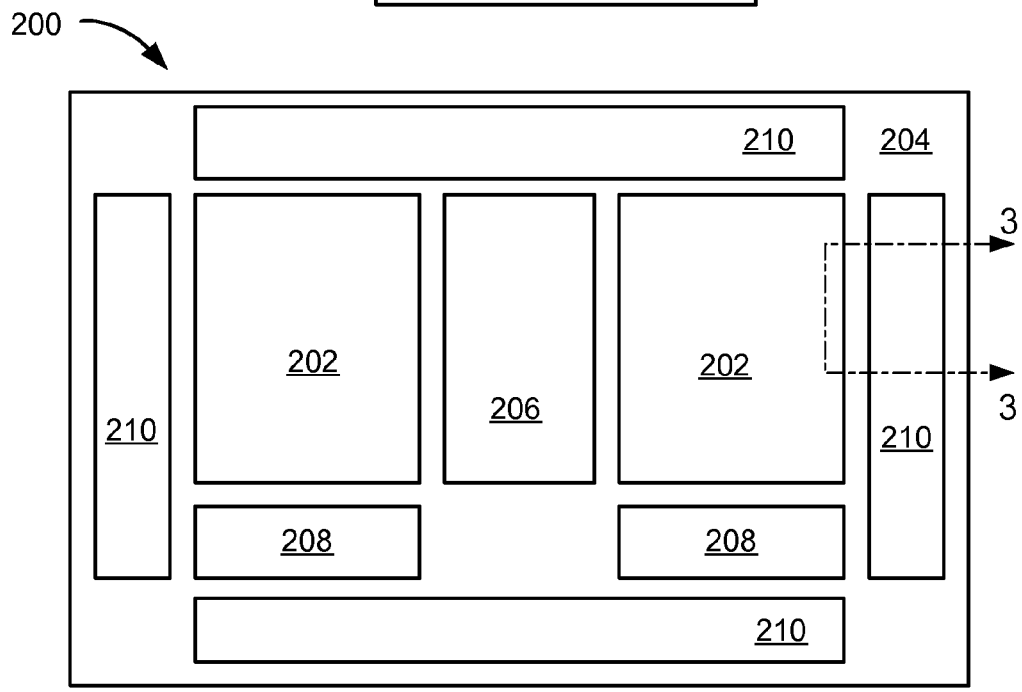
FIG. 2 is a plan view of an integrated circuit in an embodiment of the present invention.

Referring now to FIG. 2, therein is shown a plan view of an integrated circuit 200 in an embodiment of the present invention. The plan view depicts an example of the integrated circuit 200 including memory systems 202 in a substrate 204, such as a semiconductor substrate, wherein the substrate 204 may include one or more high-density core regions and one or more low-density peripheral portions are formed.

High-density core regions typically include one or more of the memory systems 202. Low-density peripheral portions typically include peripheral circuitry 210, such as input/output (I/O) circuitry or transistors interfacing to the memory systems 202, and programming circuitry for individually and selectively addressing a location in each of the memory systems 202.

The programming circuitry is represented in part by and includes one or more x-decoders 206 and y-decoders 208, cooperating with the peripheral circuitry 210 for connecting the source, gate, and drain of selected addressed memory cells to predetermined voltages or impedances to effect designated operations on the memory cell, e.g. programming, reading, and erasing, and deriving necessary voltages to effect such operations. For illustrative purposes, the integrated circuit 200 is shown as a memory device, although it is understood that the integrated circuit 200 may include other semiconductor devices having other functional blocks, such as a digital logic block, a processor, or other types of memories.

Figure 3:
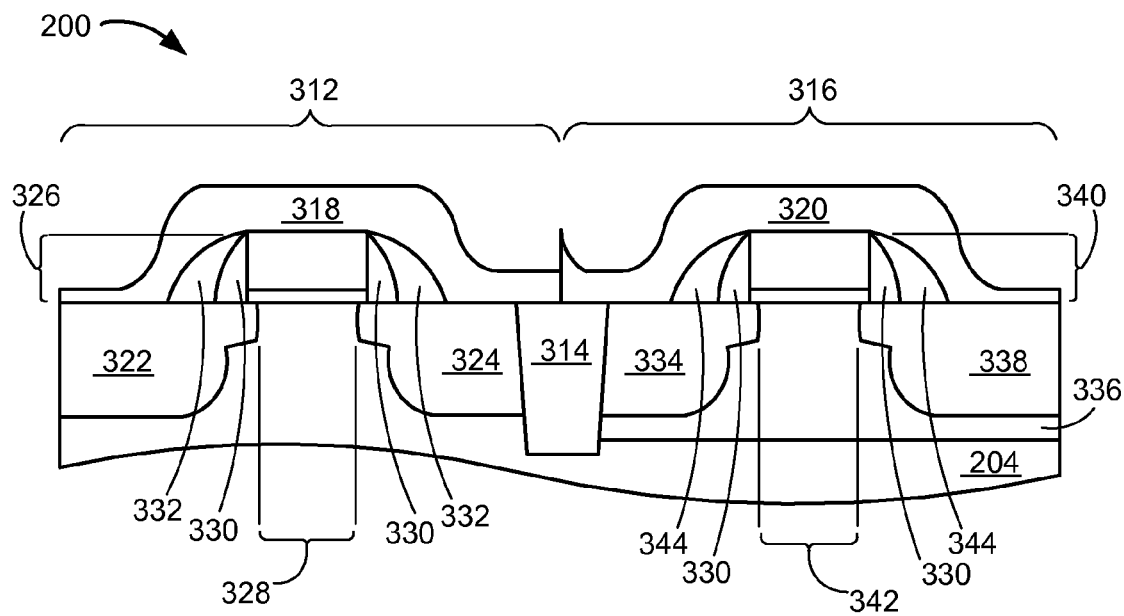
FIG. 3 is a cross-sectional view of a portion of the integrated circuit along 3-3 of FIG. 2.

Referring now to FIG. 3, therein is shown a cross-sectional view of a portion of the integrated circuit 200 along 3-3 of FIG. 2. The integrated circuit 200 includes the substrate 204, such as a p-type substrate, having a first circuit element 312, an isolation region 314, a second circuit element 316, a first stress formation liner 318, such as a tensile layer of nitride or silicon nitride, and a second stress formation liner 320, such as a compression layer of nitride or silicon nitride. The first stress formation liner 318 is preferably over the first circuit element 312. The second stress formation liner 320 is preferably over the second circuit element 316.

The first circuit element 312, such as an n-type metal oxide semiconductor (NMOS) transistor, includes a first source 322, such as an n-type source, formed in the substrate 204. A first drain 324, such as an n-type drain, is formed in the substrate 204.

A first gate stack 326 is over the substrate 204 and over a first channel region 328. The first channel region 328 is in the substrate 204 and between the first source 322 and the first drain 324. An oxide liner 330 may be formed adjacent to the first gate stack 326 over the first source 322 and the first drain 324. A first spacer 332 is preferably formed over the oxide liner 330 surrounding the first gate stack 326 as well as over the first source 322 and the first drain 324.

The second circuit element 316, such as a p-type metal oxide semiconductor (PMOS) transistor, includes a second source 334 formed in a well region 336, such as an n-type well. The well region 336 is in the substrate 204. A second drain 338 is formed in the well region 336.

A second gate stack 340 is preferably formed over the substrate 204 and over a second channel region 342. The second channel region 342 is in the well region 336 located between the second source 334 and the second drain 338.

The oxide liner 330 is formed adjacent to the second gate stack 340 over the second source 334 and the second drain 338. A second spacer 344 is formed on the oxide liner 330 surrounding the second gate stack 340 as well as over the second source 334 and the second drain 338.

As an example, the first stress formation liner 318 over the first circuit element 312 provides tensile stress to the first channel region 328. This tensile stress strains the first channel region 328 to increase electron mobility thereby increasing performance, lowering power consumption, or a combination thereof of the first circuit element 312.

Continuing with the example, the second stress formation liner 320 over the second circuit element 316 provides compression stress to the second channel region 342. This compression stress strains the second channel region 342 to increase hole mobility thereby increasing performance, lowering power consumption, or a combination thereof of the second circuit element 316.

Figure 4:
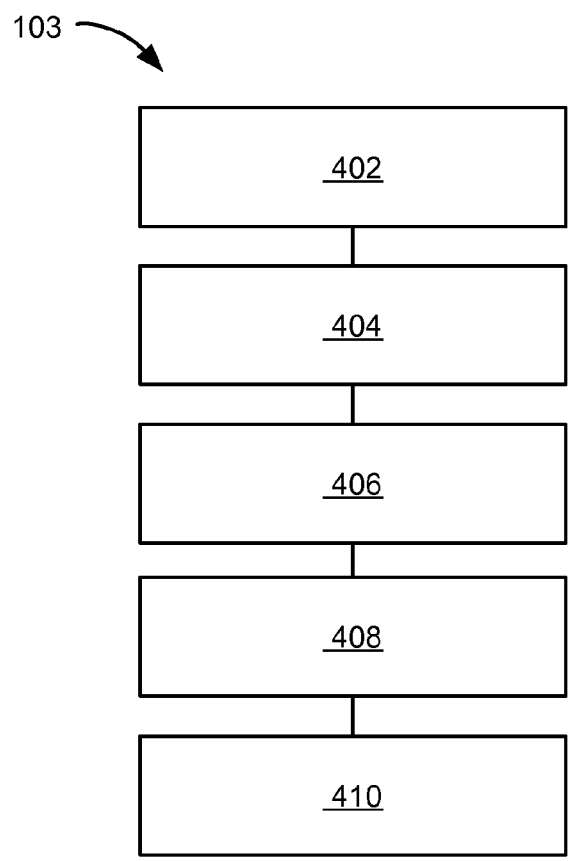
FIG. 4 is a more detailed block diagram of the analysis block of FIG. 1.

Referring now to FIG. 4, therein is shown a more detailed block diagram of the analysis block 103 of FIG. 1. A normalization block 402 normalizes electrical data measured from test devices to a reference device. A transfer function generation block 404 may follow the normalization block 402 and simulates electrical data or the normalized electrical data with scanned mobility multipliers. A data conversion block 406 may follow the transfer function generation block 404 and converts the measured electrical data to mobility multipliers. A stress model fit block 408 may follow the data conversion block 406 and fits stress models onto the mobility multipliers from the data conversion block 406. A validation block 410 may follow the stress model fit block 408 and validates the methodology by simulating the stress models in a device simulator and the electrical data is calculated and compared to the converted electrical data.

Figure 5:
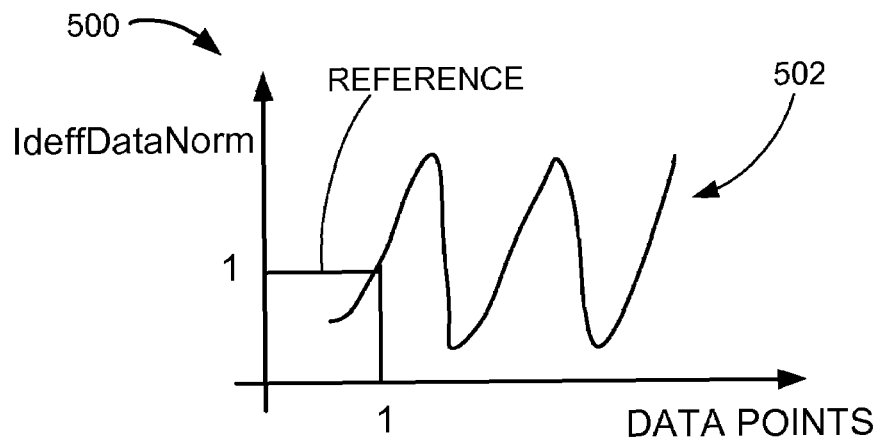
FIG. 5 is a graphical view of a normalized plot from the normalization block of FIG. 4.

Referring now to FIG. 5, therein is shown graphical view of a normalized plot 500 from the normalization block 402 of FIG. 4. The normalized plot 500 may be formed executing the generation block 101 of FIG. 1, the extraction block 102 of FIG. 1, and the presentation block 104 of FIG. 1 in addition to the analysis block 103.

Stress, denoted as "σ" may be expressed generally as Equation 1:

$$\sigma = f_1(I) \quad (1)$$

The stress "σ" is a function of "I" which represent electrical data. The electrical data may be a number of measured electrical data. For example, measured electrical data for stress models may include $I_{deff}$, $I_{odlin}$, $I_{dlin}$, $I_{high}$, $I_{mid}$, $I_{low}$, $I_{dlin\_hi}$, etc., wherein $I_{deff}$ is an effective drain current, herein will be used interchangeably with the electrical data for "I". The measured electrical data may be from devices or test structures in the system-under-test 106 of FIG. 1 and measured with the tester 105 of FIG. 1.

The relationship between stress "σ" and mobility may be expressed by Equation 2:

$$\sigma = f_2(k, \mu_{eff0}) \quad (2)$$

The "k" represents a mobility multiplier having either a positive or a negative value. The mobility of the first circuit element 312 of FIG. 3 and a reference device (not shown) is denoted as $\mu_{eff0}$. $f_2$ is a function. Normalized mobility or the mobility multiplier "k" is needed to fit design models for the design and manufacture of the integrated circuit 200 of FIG. 2. The reference device is a device, for example a transistor, which has nominal impact from stress or strain with a mobility multiplier of 1.

The reference device may include the first circuit element 312 or a portion thereof. The reference device may include modified structures to the first circuit element 312 varying device parameters to provide additional data points for developing the design models. Examples of device parameters are device feature size, spacing between device elements, or size and spacing of stress liners.

Mobility multipliers of devices, such as the first circuit element 312 or test devices, other than the reference device correspond to k, or the mobility in the first channel region 328 of FIG. 3 divided by mobility or $\mu_{eff0}$ of the reference device. Typically, mobility is assumed as being 1 to 1 proportional to one of the electrical parameters, such as $I_{deff}$, and similarly normalized mobility is assumed as being 1:1 proportional to one of the normalized parameters. This one to one proportionality introduces significant errors into the design models.

Increasing the mobility multiplier does not result in a similar improvement in the effective drain current. Increasing mobility multiplier by 20%, as an example, will result in less than 20% improvement in effective drain current. Similarly, a decrease of 20% in the mobility would result in a lesser decrease in the effective drain current.

Stress data from wafers are measured as the electrical data, such as $I_{deff}$, $I_{odlin}$, $I_{dlin}$, $I_{high}$, $I_{mid}$, $I_{low}$, $I_{dlin\_hi}$, etc., which are affected by the stress. The electrical data needs to be converted to mobility multipliers to fit stress models. The normalized plot 500 includes an x-axis for the data points of the test devices measured, including the reference device. For example, a test structure implemented in the test device may have certain parameters, such as stress value of a stress source or distance from a stress source. These different parameters will result in a different measured electrical data. The x-axis is an enumeration over a set of test structures, where certain stress parameters are changed to see the impact on device performance. A y-axis of the normalized plot 500 includes normalized measured electrical data, shown as IdeffDataNorm.

A method to accurately convert from electrical data to mobility multipliers is as follows. A modelcard refers to the simulation model and its parameters to describe a transistor operation, such as current-voltage (I-V) curves. As mentioned earlier, the reference device preferably has a mobility multiplier of 1. After the electrical data has been measured, the electrical data undergoes the normalization where $I_{deff}$'s from measurements are normalized with respect to that of the reference device forming a normalized curve 502 such that the reference device has a normalized $I_{deff}$ value of 1. As an example, normalization may be achieved by dividing a value by that of the reference device. Although normalization to 1 is described, the normalization can be for a value other than 1, or the system can use no normalization at all, which corresponds to a normalization using a normalization factor of 1.

Figure 6:
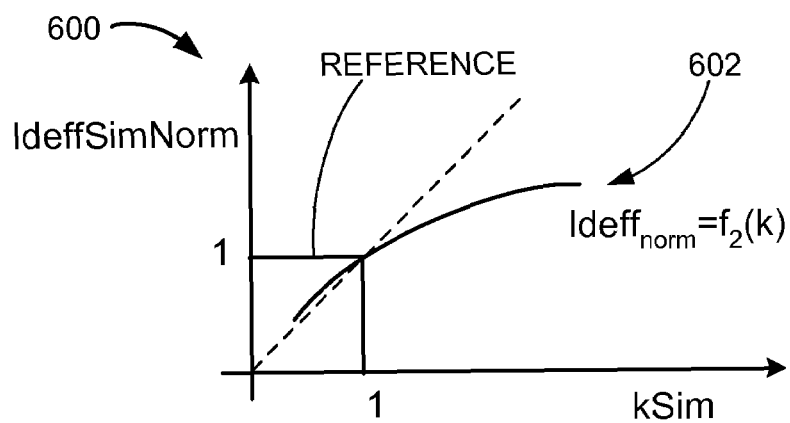
FIG. 6 is a graphical view of a transfer plot from the transfer function generation block of FIG. 4.

Referring now to FIG. 6, therein is shown a graphical view of a transfer plot 600 from the transfer function generation block 404 of FIG. 4. The transfer plot 600 may be formed executing the extraction block 102 of FIG. 1 and the presentation block 104 of FIG. 1 in addition to the analysis block 103.

The transfer plot 600 includes an x-axis for the input mobility multipliers, shown as kSim, and a y-axis for simulated electrical data, shown as IdeffSimNorm. A modelcard for the reference device is used to scan the mobility multiplier in a device level simulation tool, such as Simulation Program with Integrated Circuit Emphasis (SPICE), for a wide range values, for example from 0.75 to 1.25. The mobility multipliers may be changed to at least 10 equidistant values in this range. The electrical data, such as $I_{deff}$, is then simulated for each "k" value. The $I_{deff}$'s are normalized with respect to reference mobility with mobility multiplier 1, and normalized IdeffSimNorm versus kSim is plotted and the data is recorded. This plot is referred to herein as a transfer curve 602. As can be seen in FIG. 6, increasing the mobility multiplier above 1 did not increased the IdeffSimNorm by a 1:1 relationship, which is indicated by the dashed curve.

Figure 7:
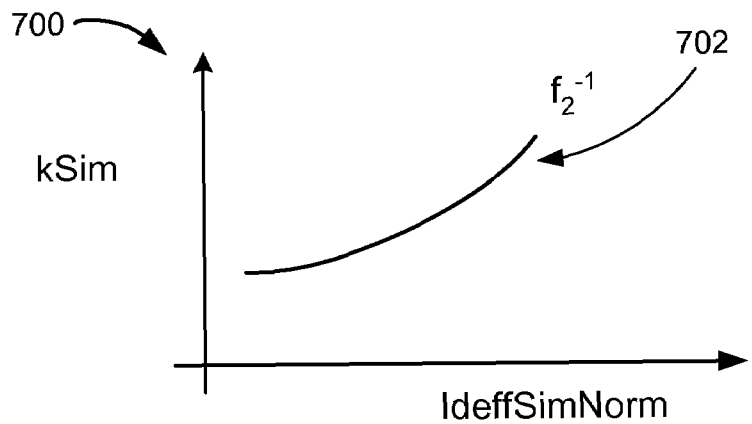
FIG. 7 is a graphical view of an inverse plot from the data conversion block of FIG. 4.

Referring now to FIG. 7, therein is shown a graphical view of an inverse plot 700 from the data conversion block 406 of FIG. 4. The inverse plot 700 may be formed executing the extraction block 102 of FIG. 1 and the presentation block 104 of FIG. 1 in addition to the analysis block 103.

The inverse plot 700 includes an x-axis for normalized simulated electrical data, shown as IdeffSimNorm, and a y-axis for the simulated mobility multipliers, shown as kSim, for the devices measured. An inverse transfer function forms the inverse plot 700 from the transfer plot 600 of FIG. 6 resulting in an inverse transfer curve 702, shown as "$f_2^{-1}$". The inverse transfer curve 702 relates simulated mobility multipliers as a function of normalized electrical data, IdeffSimNorm. The inverse transfer curve 702 is used to map the normalized measured electrical data, IdeffDataNorm, to second (or converted) mobility multipliers, kConv, by using IdeffDataNorm in the x axis as the input. This step enables conversion of measured electrical data to accurate mobility multipliers (hence mobility values).

Figure 8:
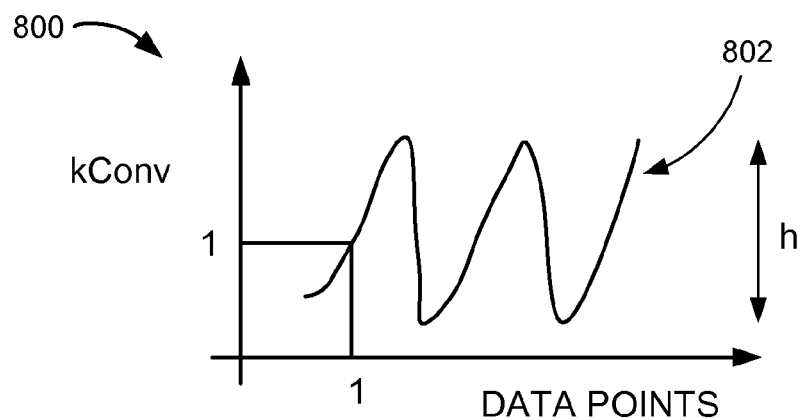
FIG. 8 is a graphical view of a stress plot from the stress model fit block of FIG. 4.

Referring now to FIG. 8, therein is shown a graphical view of a stress plot 800 from the stress model fit block 408 of FIG. 4. The stress plot 800 may be formed executing the extraction block 102 of FIG. 1 and the presentation block 104 of FIG. 1 in addition to the analysis block 103.

The stress plot 800 includes an x-axis as the enumeration over the measured test devices and a y-axis for converted mobility multipliers from the previous step, shown as kConv, from the measured test devices. For example, a test structure implemented in the test device may have certain parameters, such as stress value of a stress source, distance from a stress source. These different parameters will result in a different measured electrical data. The x-axis is an enumeration over a set of test structures, where certain stress parameters are changed to see the impact on device performance. The stress models are fit on to the converted mobility multipliers. This gives accurate results as compared to fitting the models on electrical data. The range of the mobility multipliers are shown as "h" which depicts a range from the minimum to the maximum of a stress curve 802.

Models are fit to data using least squares fit or a similar mathematical fit, where parameters of the model are extracted such that model curves fit to the curves of data points. Instead of fitting the models to data in FIG. 5, the models are fitted in FIG. 8 and fit to mobility multipliers instead, thereby improving accuracy by at least 5%, as the fitting at FIG. 5 assumes there would be 1:1 correlation between normalized $I_{deff}$ and mobility multipliers.

Figure 9:
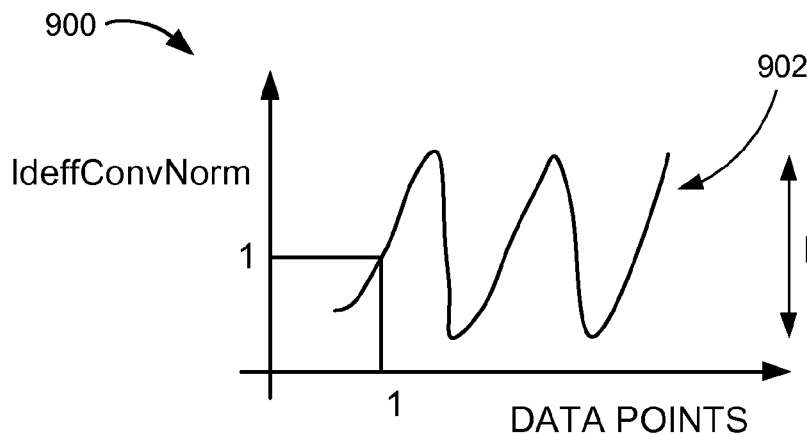
FIG. 9 is a graphical view of a compare plot from the validation block of FIG. 4.

Referring now to FIG. 9, therein is shown a graphical view of a compare plot 900 from the validation block 410 of FIG. 4. The compare plot 900 may be formed executing the extraction block 102 of FIG. 1 and the presentation block 104 of FIG. 1 in addition to the analysis block 103.

The compare plot 900 includes an x-axis for the data points of the measured test devices, including the reference device. For example, a test structure implemented in the test device may have certain parameters, such as stress value of a stress source, distance from a stress source. These different parameters will result in a different measured electrical data. The x-axis is an enumeration over a set of test structures, where certain stress parameters are changed to see the impact on device performance. A y-axis of the compare plot 900 includes converted normalized electrical data, shown as IdeffConvNorm. To validate the methodology, stress models are used in circuit simulations, $I_{deff}$ is calculated and compared with measured $I_{deff}$ to determine model accuracy. The range of the un-normalized measured electrical data, shown as $I_{deff}$ are shown as "h'" which depicts a range from the minimum to the maximum of a compare curve 902.

As mobility is increased, the increase in $I_{deff}$ is less, as seen in the normalized plot 500 of FIG. 5. This is the reason why the height "h" in the stress plot 800 of FIG. 8 is larger than the height "h'" in the compare plot 900. The data points correspond to the electrical measurements obtained from the test devices with various stress components. The validation may be performed either with a normalized curve or an unnormalized curve.

Figure 10:
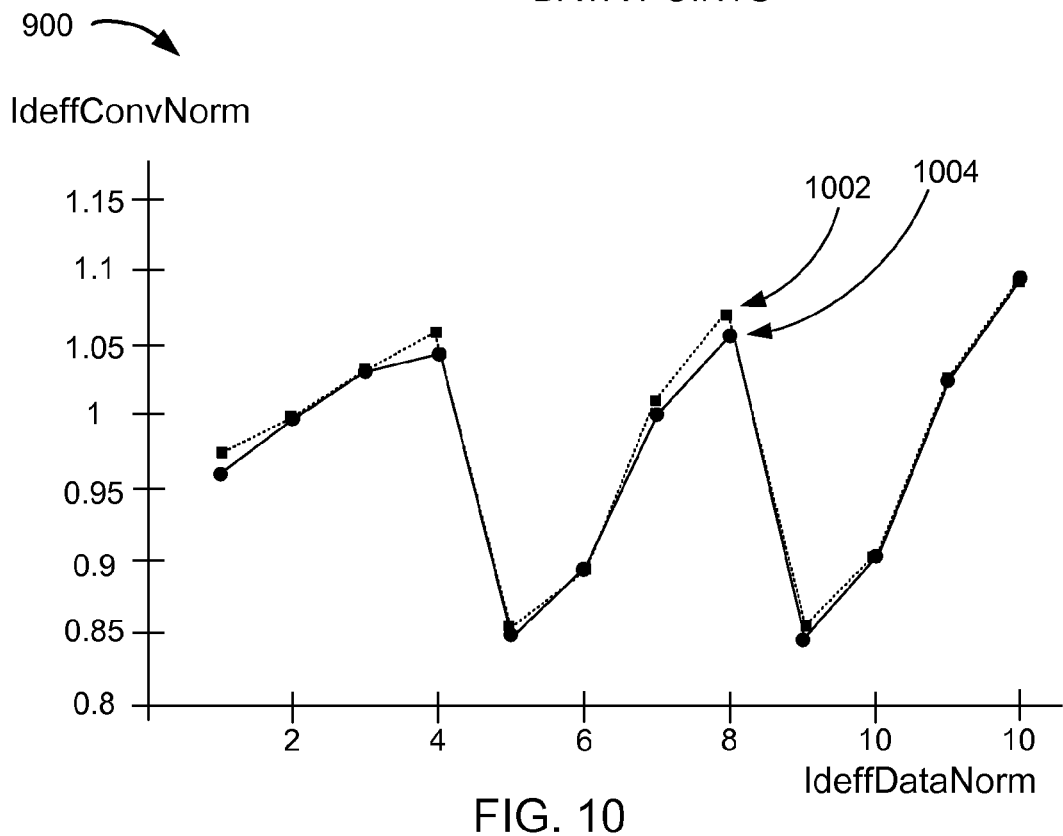
FIG. 10 is a more detailed graphical view of the compare plot of FIG. 9.

Referring now to FIG. 10, therein is shown a more detailed graphical view of the compare plot 900 of FIG. 9. As mentioned earlier, the compare plot 900 includes the x-axis for the data points of the measured test devices, shown as IdeffDataNorm, including the reference device and the y-axis of the compare plot 900 for converted normalized electrical data, shown as IdeffConvNorm.

The compare curve 902 of FIG. 9 is shown as two function curves, a measured curve 1002 and a simulated curve 1004. The modeling flow described from FIG. 5 through FIG. 9 provides a more accurate correlation for mobility values for a design tool than previously possible with the 1:1 proportional assumption.

It has been discovered that the present invention more accurately models the performance of strained transistors by at least 5% and as much as 50 to 100% more accurate. The steps presented more accurately models the non-linear relationship between the measured electrical data with mobility multipliers resulting in the improved accuracy.

Figure 11A:
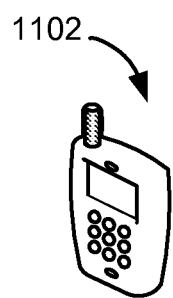
FIGS. 11A, 11B, and 11C are schematic views of examples of electronics systems in which various aspects of the present invention may be implemented.
Figure 11B:
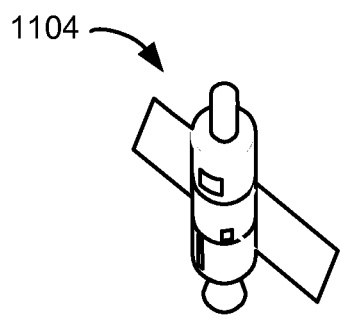
Figure 11C:
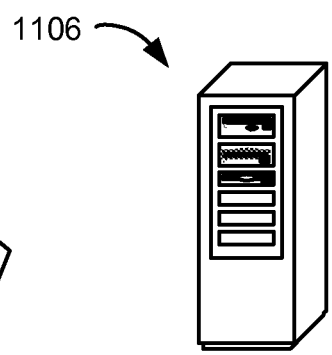

Referring now to FIGS. 11A, 11B, and 11C, therein are shown schematic views of examples of electronics systems in which various aspects of the present invention may be implemented. A smart phone 1102, a satellite 1104, and a compute system 1106 are examples of the electronic systems using the present invention. The electronic systems may be any system that performs any function for the creation, transportation, storage, and consumption of information. For example, the smart phone 1102 may create information by transmitting voice to the satellite 1104. The satellite 1104 is used to transport the information to the compute system 1106. The compute system 1106 may be used to store the information. The smart phone 1102 may also consume information sent from the satellite 1104.

The electronic systems, such as the smart phone 1102, the satellite 1104, and the compute system 1106, include a one or more subsystem, such as a printed circuit board having the present invention or an electronic assembly having the present invention. The electronic system may also include a subsystem, such as an adapter card.

Figure 12:
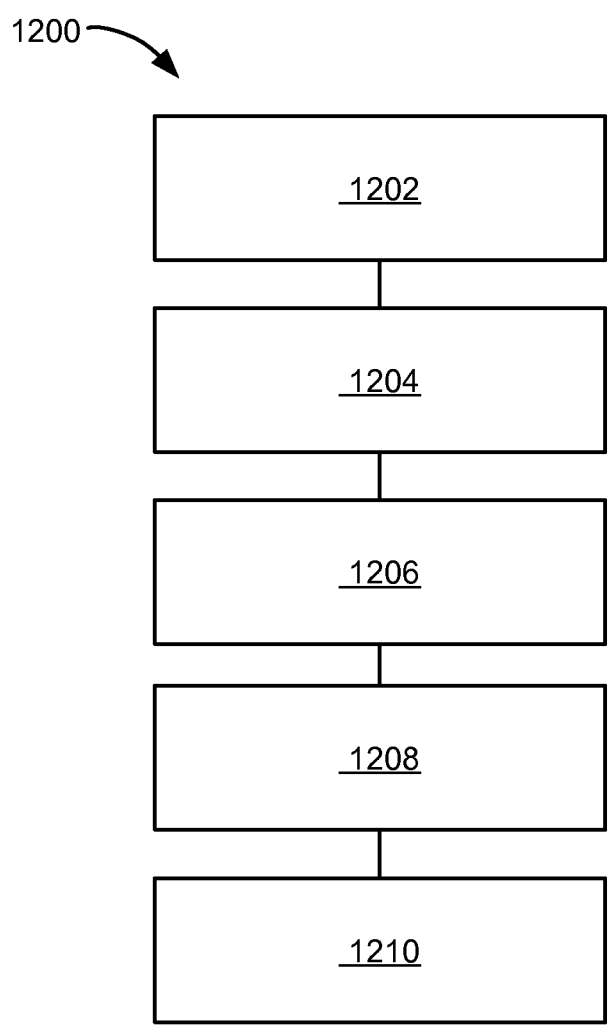
FIG. 12 is a flow chart of for a method of operating an integrated circuit tester information processing system for modeling of the integrated circuit in an embodiment of the present invention.

Referring now to FIG. 12, therein is shown a flow chart of for a method 1200 of operating the integrated circuit tester information processing system 100 for modeling of the integrated circuit 200 in an embodiment of the present invention. The method 1200 includes measuring current information from test structures for an integrated circuit having a stress liner in a block 1202; forming a transfer curve by simulation based on the current information with a first range of first mobility multipliers in a block 1204; forming an inverse transfer curve by applying an inverse transfer function to the transfer curve in a block 1206; forming a stress curve with second mobility multipliers from the inverse curve in a block 1208; and validating the second mobility multipliers by comparing a measured curve and a simulated curve with the measured curve based on the current information and the simulated curve based on stress curve in a block 1210.

These and other valuable aspects of the present invention consequently further the state of the technology to at least the next level.

Thus, it has been discovered that the integrated circuit tester information processing system method and apparatus of the present invention furnish important and heretofore unknown and unavailable solutions, capabilities, and functional aspects for memory systems. The resulting processes and configurations are straightforward, cost-effective, uncomplicated, highly versatile, accurate, sensitive, and effective, and can be implemented by adapting known components for ready, efficient, and economical manufacturing, application, and utilization.

The resulting processes and configurations are straightforward, cost-effective, uncomplicated, highly versatile and effective, can be implemented by adapting known technologies, and are thus readily suited for efficiently and economically manufacturing memory systems.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for operating an integrated circuit tester information processing system comprising:
   measuring current information from test structures for an integrated circuit having a stress liner;
   forming a transfer curve by simulating based on the current information with a first range of first mobility multipliers;
   forming an inverse transfer curve by applying an inverse transfer function to the transfer curve;
   forming a stress curve with second mobility multipliers from the inverse transfer curve; and
   validating the second mobility multipliers by comparing a measured curve and a simulated curve with the measured curve based on the current information and the simulated curve based on the stress curve.

2. The method as claimed in claim 1 further comprising:
   forming a normalized curve by normalizing the current information to a reference device; and
   wherein forming the transfer curve by simulating based on the current information with the first range of the first mobility multipliers includes:
   simulating normalized currents with the first range of the first mobility multipliers.

3. The method as claimed in claim 1 wherein forming the transfer curve includes simulating the current information for each first mobility multipliers in the first range for forming the second mobility multipliers.

4. The method as claimed in claim 1 wherein forming the inverse transfer curve by applying the inverse transfer function to the transfer curve includes mapping the normalized measured current to the second mobility multipliers and model fitting.

5. The method as claimed in claim 1 wherein forming the stress curve with the second mobility multipliers from the inverse curve includes fitting a stress function with the second mobility multipliers.

6. A method for operating an integrated circuit tester information processing system comprising:
   measuring current information from test structures for an integrated circuit having a stress liner;
   forming a normalized curve by normalizing the current information to a reference device;
   forming a transfer curve by simulating normalized currents with a first range of first mobility multipliers for forming second mobility multipliers;
   forming an inverse transfer curve by applying an inverse transfer function to the transfer curve including mapping the normalized measured current to the second mobility multipliers and model fitting;
   forming a stress curve with the second mobility multipliers from the inverse transfer curve; and
   validating the second mobility multipliers by comparing a measured curve and a simulated curve with the measured curve based on the current information and the simulated curve based on the stress curve.

7. The method as claimed in claim 6 further comprising:
   forming a design model with the second mobility multipliers; and
   manufacturing the integrated circuit with the design model.

8. The method as claimed in claim 6 further comprising:
   forming a design model with the second mobility multipliers;
   manufacturing the integrated circuit with the design model; and
   manufacturing an electronic system with the integrated circuit.

9. The method as claimed in claim 6 further comprising measuring current information from test structures for the integrated circuit includes measuring the test structures for modeling a circuit element in the integrated circuit.

10. The method as claimed in claim 6 wherein forming the normalized curve by normalizing the current information to the reference device includes measuring the reference device for the current information.

11. An integrated circuit tester information processing system comprising:
    measurement circuitry for measuring current information from test structures for an integrated circuit having dual stress liners;
    analysis circuitry coupled to the measurement circuitry for:
      simulating based on the current information with a first range of first mobility multipliers,
      applying an inverse transfer function to the normalized currents,
      validating second mobility multipliers from the inverse transfer function; and
    presentation circuitry coupled to the analysis circuitry for:
      forming a normalized curve from the normalizing the current information,
      forming a transfer curve from the simulating the normalized currents,
      forming an inverse transfer curve from the applying the inverse transfer function,
      forming a stress curve with the second mobility multipliers, and
      forming a measured curve and a simulated curve with the measured curve based on the current information and the simulated curve based on the stress curve.

12. The system as claimed in claim 11 wherein the analysis circuitry is for forming a normalized curve by normalizing the current information to a reference device.

13. The system as claimed in claim 11 wherein the analysis circuitry is for simulating the current information for each first mobility multipliers in the first range for forming the second mobility multipliers.

14. The system as claimed in claim 11 wherein the analysis circuitry is for mapping the normalized measured current to the second mobility multipliers and modeling fitting.

15. The system as claimed in claim 11 wherein the analysis circuitry is for fitting a stress function with the second mobility multipliers.

16. The system as claimed in claim 11 wherein the analysis circuitry is for:
    simulating the current information for each first mobility multipliers in the first range for forming the second mobility multipliers;
    mapping the normalized measured current to the second mobility multipliers; and
    fitting a stress function with the second mobility multipliers.

17. The system as claimed in claim 16 wherein the analysis circuitry is for:

forming a design model with the second mobility multipliers; and further comprising:

a production circuitry for manufacturing the integrated circuit with the design model.

18. The system as claimed in claim 16 wherein the analysis circuitry is for:

forming a design model with the second mobility multipliers; and further comprising a production circuitry for:

manufacturing the integrated circuit with the design model; and manufacturing an electronic system with the integrated circuit.

19. The system as claimed in claim 16 wherein the analysis circuitry is for modeling a circuit element in the integrated circuit.

20. The system as claimed in claim 16 wherein the measurement circuitry is for measuring the reference device for the current information.

* * * * *